United States Patent [19]

Iida

[11] Patent Number: 5,077,487
[45] Date of Patent: Dec. 31, 1991

[54] DRIVER CIRCUIT FOR A LARGE CAPACITY SWITCHING ELEMENT

[75] Inventor: Katsuji Iida, Ebina, Japan

[73] Assignee: Toyo Denki Seizo Kabushiki Kaisha, Japan

[21] Appl. No.: 575,312

[22] Filed: Aug. 30, 1990

[30] Foreign Application Priority Data

Sep. 8, 1989 [JP] Japan .............................. 1-234456

[51] Int. Cl.$^5$ ............................................ H03K 17/56
[52] U.S. Cl. .................................... 307/248; 307/258; 307/570; 307/630; 307/633; 307/254; 307/270
[58] Field of Search ............... 307/258, 570, 630, 633, 307/639, 642, 248, 254, 259, 270

[56] References Cited

U.S. PATENT DOCUMENTS

| 4,297,594 | 10/1981 | Onda et al. | 307/633 |
| 4,298,809 | 11/1981 | Onda et al. | 307/633 |
| 4,675,543 | 6/1987 | Mitsuoka | 307/633 |
| 4,831,288 | 3/1989 | Chida et al. | 307/633 |

FOREIGN PATENT DOCUMENTS

| 0113238 | 9/1979 | Japan | 307/633 |
| 0053177 | 4/1980 | Japan | 307/633 |
| 0151264 | 9/1982 | Japan | 307/633 |
| 0000116 | 1/1985 | Japan | 307/633 |

Primary Examiner—Stanley D. Miller
Assistant Examiner—Terry D. Cunningham
Attorney, Agent, or Firm—Silverman, Cass & Singer, Ltd.

[57] ABSTRACT

A driver circuit for a large capacity switching element like power transistors etc. having an overdrive function. The driver circuit supplies a sharp overdrive current only at the build-up time and the control thereafter is effected by a constant current source so that the current limiting resistor can be saved and the current capacity of the various elements may be decreased.

4 Claims, 4 Drawing Sheets 5,077,487

DRIVER CIRCUIT FOR A LARGE CAPACITY SWITCHING ELEMENT

BACKGROUND OF THE INVENTION

1. Field of the Invention

The present invention relates to a driver circuit for driving into ON and OFF conditions of a large capacity switching element, such as a gate turnoff thyristor (GTO), a power transistor, a static inductive thyristor (SITH), etc., and more particularly to a driver circuit for supplying a large current at the starting time of the ON-condition, which is so called overdrive function.

2. Related Art Statement

As a driver circuit for a switching element and more especially such a circuit having overdrive function, a basic circuit shown in FIG. 7 has been known.

Namely, FIG. 7 shows in general a conventional embodiment for a basic driver circuit having such an overdrive function. In FIG. 7, 1 indicates a switching element to be controlled, 2, 3 and 4 are D.C. voltage sources, 5 and 6 are resistors for current limiting, 7 a switching element for overdriving, 8 a switching element for continuous ON condition, 9 an inverter circuit for signal polarity reversing, 10 a monostable multivibrator circuit for deciding the overdrive period, and 11 is a switching element for the OFF condition.

When a control signal $S_c$, (in this case, low level signal (L) as shown in the drawing), is applied, the switching element 11 is turned off and at the same time, the inverter circuit 9 and the monostable multivibrator circuit 10 operate and causing the switching elements 8 and 7 to be turned on. In this situation, a large overdrive current is applied from the D.C. voltage source 4 via the resistor 5 to the controlling terminal of the controlled switching element 1, and at the same time, a continuous ON current is supplied from the D.C. source 2 via the resistor 6 to said controlling terminal. The switching element 7 keeps the ON condition for a period decided by the monostable multivibrator 10, and after lapse of said period i.e. after it is off, a current supplied only from the switching element 8.

When the control signal $S_c$ disappears i.e. a high level signal H appears at the input terminal, the switching element 8 is turned off, and at the same time the switching element 11 is turned on. Then, a reverse polarity from the D.C. voltage source 3 is applied to the controlling terminal of the controlled switching element 1 and this element 1 is turned off by an OFF current passing therethrough.

However, in such a known device as shown in FIG. 7, the resistance values of the resistors 5 and 6 are decided by considering the minimum voltage value in the voltage variation ranges of the D.C. voltage sources 4 and 2, the maximum values of the ON time voltage drop of the switching elements 7 and 8, and the maximum value of the voltage drop between controlling terminals of the controlled switching element 1 so that when considering a case in which these values are normal, the capacity of the driving current of the controlled switching element, becomes unnecessarily large.

Accordingly, such a known device has disadvantages and problems in that the losses in the resistors 5 and 6 are too large and that the capacity of D.C. voltage sources becomes too large since three circuits of the D.C. voltage source are required.

SUMMARY OF THE INVENTION

The present invention is to solve the above-mentioned problems.

In the present invention, the driver current for turning on the controlled switching element is supplied from a constant current circuit. The constant current circuit is arranged to supply a large current only at the starting time of the ON condition of the controlled switching element by increasing the current value at a time immediate before the ON time of the controlled switching element while it is still in OFF condition, and thereafter the current is gradually decreased so as to operate the controlled switching element by a current required for its operation. When the controlled switching element is brought into the OFF condition, the constant current circuit is by-passed and at the same time the OFF current of the controlled switching element is fed from a controlling switching element.

In accordance with the present invention, the conventional current limiting resistor can be dispensed with so that by a simple circuit configuration, an overdrive current can be supplied and the driver current of the controlled switching element may not vary by the voltage variation of the D.C. voltage source.

DETAILED EXPLANATION FOR THE PREFERRED EMBODIMENT

The applicant had proposed "Base driving circuit of a transistor" under Japanese Application No. 22,161/89. The present invention is further to expand the previous disclosure and more especially it is an addition of overdrive function.

In order to give an easy understanding of the basic technical idea of the present invention, a fundamental circuit of the same will be explained by referring to FIG. 1.

Figure 1:
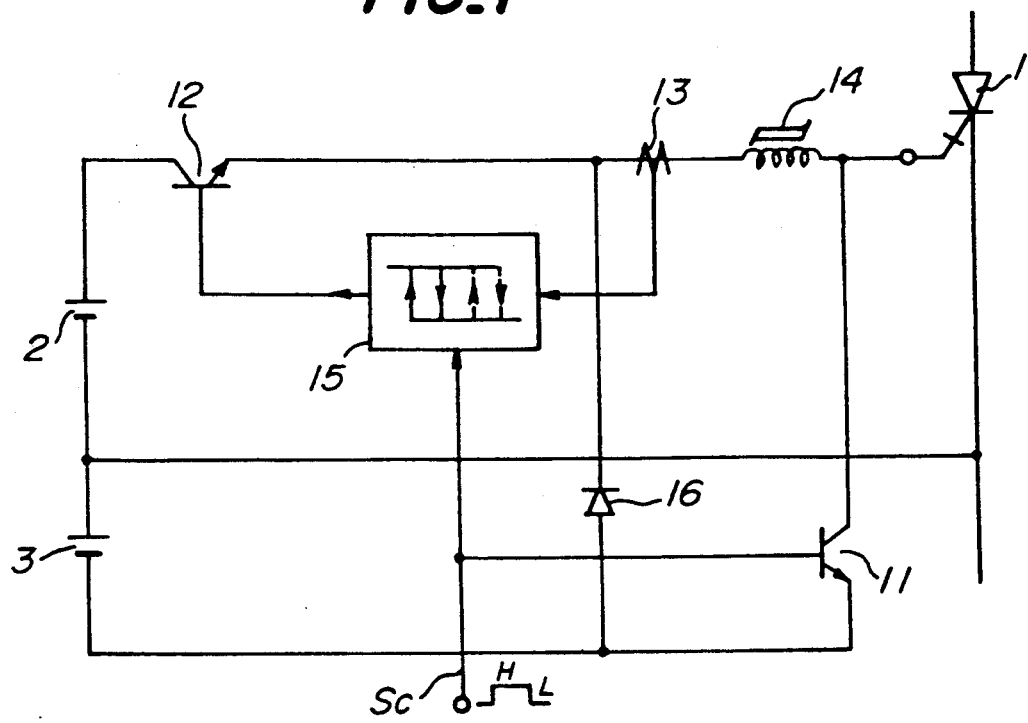
FIG. 1 is a circuit diagram for showing a basic circuit configuration of the present invention.
Figure 7:
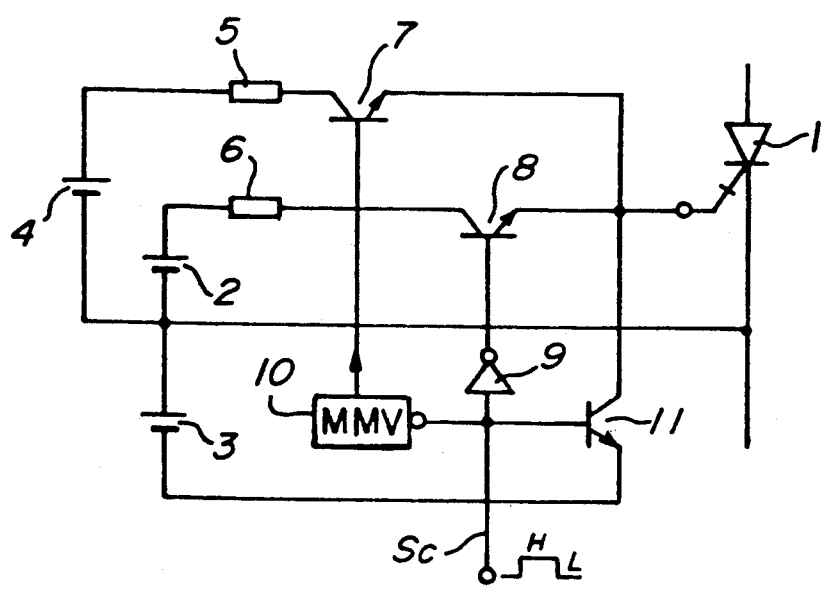
FIG. 7 shows a basic circuit configuration of a known embodiment, which had just been explained.

FIG. 1 shows a basic circuit configuration of the present invention, which shows a switching element 12 for effecting the chopping, a current detecting element 13, a reactor 14, a hysteresis comparator 15 and a diode 16. In this drawing the same constructive parts with that shown in FIG. 7 are shown by the same reference numerals.

Wherein, the hysteresis comparator 15 detects an output voltage of the current detecting element 13 and controls the switching element 12 into OFF condition at a predetermined upper limit value of the current flowing through the reactor 14 and into ON condition at its lower limit value and said upper and lower limit values may be shifted by a control signal $S_c$. A practical embodiment of this hysteresis comparator 15 is shown in FIG. 6 and will be explained in detail afterwards.

Figure 6:
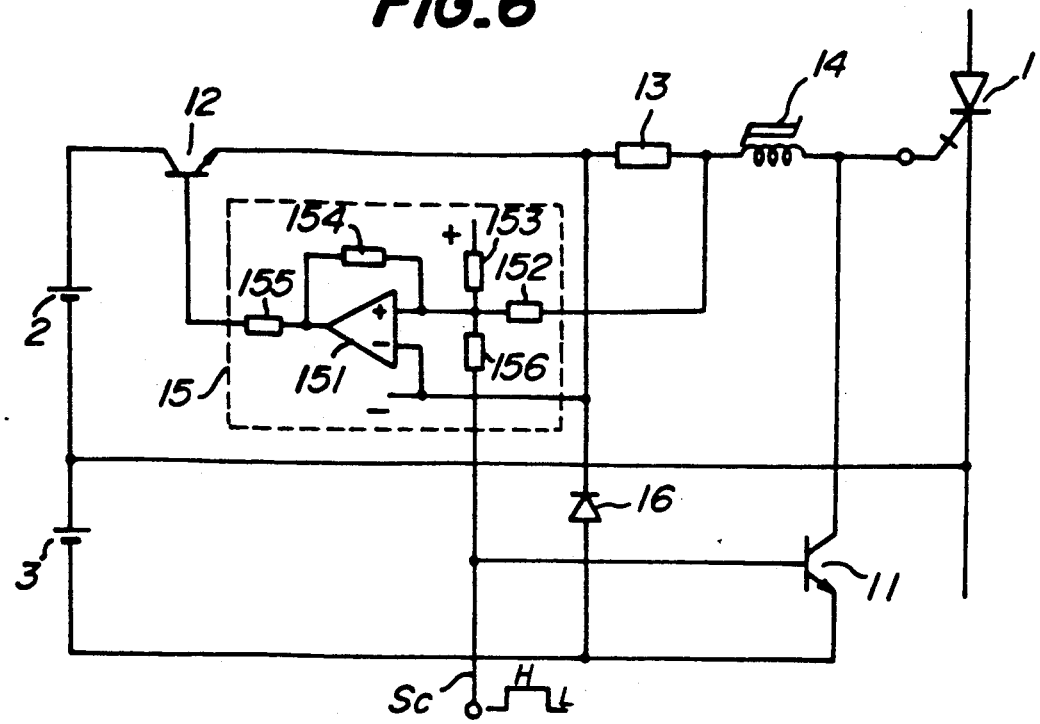
FIG. 6 is a circuit diagram for showing a practical embodiment of a hysteresis comparator.

However in brief as can be seen from FIG. 6, two series connected D.C. voltage sources 2 and 3 at positive and negative side, respectively, are arranged. Between the positive and negative terminals of the positive side D.C. voltage source 2, a series circuit unit comprising the following elements is connected.

switching element 12→current detecting element 13→reactor 14→control terminals of the controlled switching element Furthermore, a diode 16 is connected with its cathode side at the connecting point between the chopping switching element 12, and the current detecting element 13 and with its anode side at the negative terminal of the D.C. voltage source 3 and the switching element 11 for controlling the controlled switching element 1 is connected between the negative terminal of the D.C. voltage source 3 and the controlling terminal of the controlled switching element 1.

The operation of the driver circuit having abovementioned construction will be explained by referring to FIGS. 2 to 5.

Figure 2:
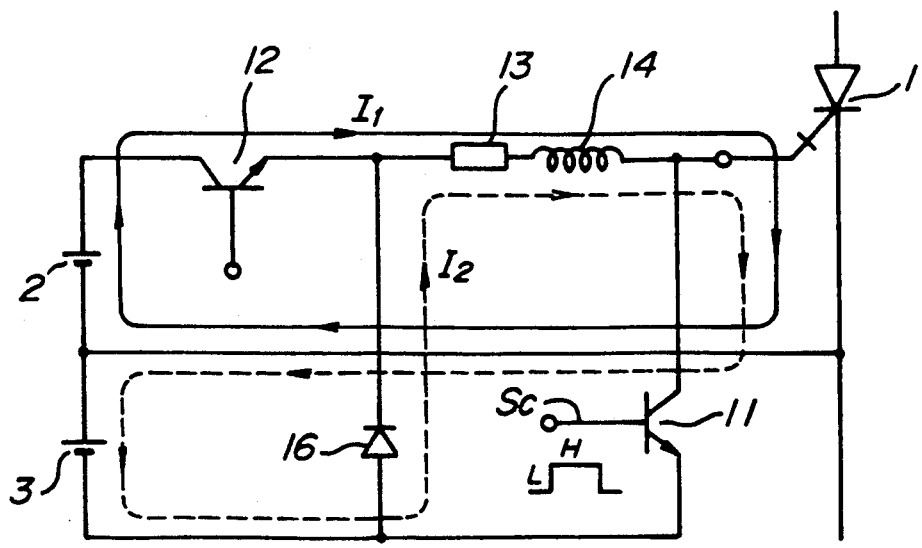
FIG. 2 is an explanatory diagram for switching on the controlled switching element.
Figure 3:
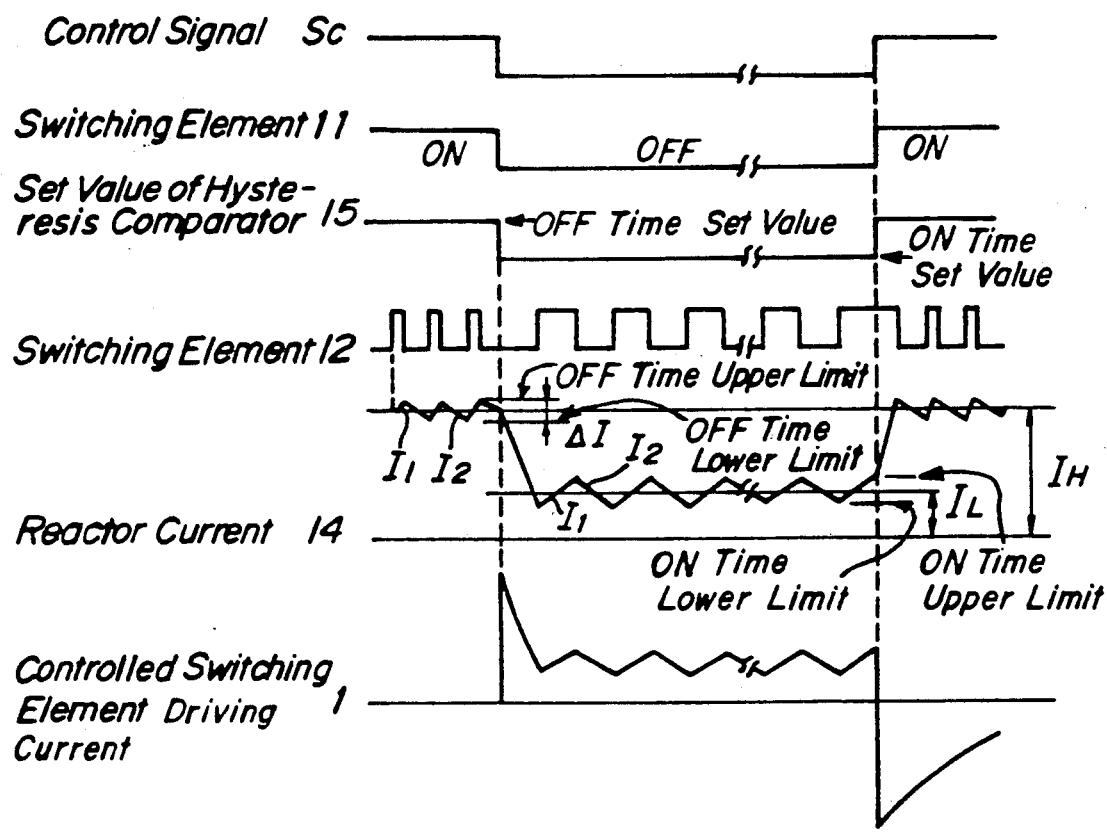
FIG. 3 is a time chart diagram at ON and OFF time of the controlled switching element.
Figure 4:
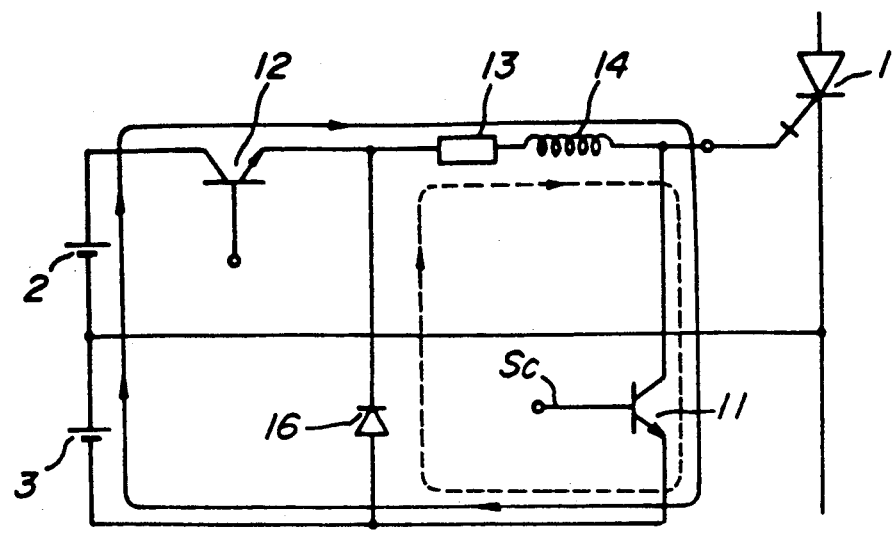
FIG. 4 is an explanatory diagram for switching off the controlled switching element.
Figure 5:
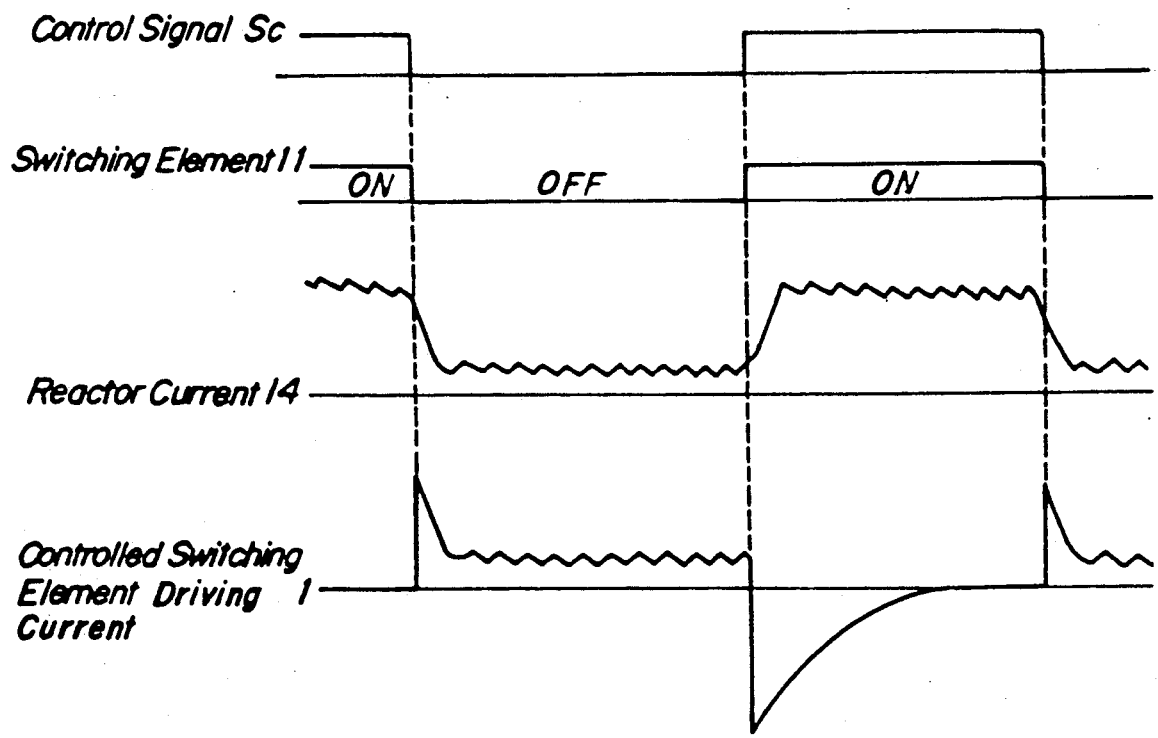
FIG. 5 is an overall time chart diagram of the device of the present invention.

Wherein, FIGS. 2 and 4 show operating diagram for switching on and off of the controlled switching element, and FIGS. 3 and 5 show overall time chart at ON and OFF condition of the controlled switching element.

At the time of switching on the controlled switching element 1, the controlling switching element 11 is turned off and at the same time regulate to lower the threshold level of the hysteresis comparator 15 both for the upper limit value and the lower limit value. Hereinafter, these values are termed as ON time upper limit value and ON time lower limit value respectively. During the term of ON condition of the controlling switching element 11, the current passing through the reactor 14 is set at high level (hereinafter termed as OFF time upper limit value and OFF time lower limit value). This current will not decrease abruptly by the action of the reactor 14 at the OFF condition of the controlling switching element 11. Accordingly, the hysteresis comparator 15 acts to keep the switching element 12 at OFF condition until the hysteresis comparator 15 reaches ON time lower limit value. After this time, the hysteresis comparator 15 operates between the ON time lower limit value and ON time upper limit value and drives the switching element 12 into ON and OFF conditions. When the switching element 12 is in ON condition, a current $I_1$ flows through a route as indicated by a full line in FIG. 2 and serves the driving current for the controlled switching element 1.

When the switching element 12 is in OFF condition, a current $I_2$ induced by the accumulated energy in the reactor 14 will flow successively in a circuit route shown by a dotted line in FIG. 2 and this current $I_2$ will keep the driving current of the controlled switching element 1. Accordingly, as has been explained in detail also in the aforementioned prior proposal of the present applicant, by effecting ON and OFF ratio control of the switching element 12 by the hysteresis comparator 15, a constant current having ripple current $\Delta I$ can be obtained. In FIG. 3, $I_H$ represents the high level and $I_L$ represents the low level.

When the control signal $S_c$ is removed, i.e. in this example to set high level H, the switching element 11 is turned on and at the same time the threshold level of the hysteresis comparator is switched into OFF time upper limit value and OFF time lower limit value respectively. By this, the current which had been flowing through the reactor 14 is switched to flow through the switching element 11 and at the same time, the OFF current originated from the controlled switching element 1 flows through the following route and the controlled switching element is turned off.

control terminal of the controlled switching element 1→switching element 11→D.C. voltage source 3.

On the other hand, as the threshold level of the hysteresis comparator 15 is set at the OFF time upper and lower limit value, the switching element 12 continues its ON condition. By this the current flowing through the reactor 14 increases until this current reaches OFF time upper limit value. When the OFF time upper limit value is reached, the switching element 12 is turned off and thereafter the current flowing through the reactor 14 is controlled to be between OFF time upper limit value and OFF time lower limit value. In this manner, when the switching element 12 is in ON condition, the current flows through a route illustrated by the full line in FIG. 4 and when it is in OFF condition, the current flows through a route indicated by the dotted line in FIG. 4. Accordingly, in the same manner with the time of turning on the controlled switching element 1, the current flowing through the reactor 14 can be controlled.

Then for turning on the controlled switching element 1, the control signal $S_c$ is applied (in this embodiment to change it into low level) and to turn off the switching element 11 and at the same time the hysteresis comparator 15 is switched to ON time upper limit value and ON time lower limit value.

By functioning the circuit having the configuration as shown in FIG. 1, it is possible to supply to the controlled switching element 1 a stable overdrive current and a succeeding continuous ON current.

A practical embodiment of the hysteresis comparator shown in FIG. 6 will be explained in more detail.

In FIG. 6, a simple resistor is used as for the current detecting element 13. The hysteresis comparator 15 comprises a voltage comparator 151 and resistors 152 to 156. Wherein, the resistor 152 acts to calculate the voltage fed from the current detecting element 13, the resistor 153 sets the upper and lower limit values in the ON condition, the resistor 156 sets the upper and lower limit values in the OFF condition, and the resistor 154 acts as a positive feedback resistor for deciding the hysteresis width (difference between the upper limit value and the lower limit value).

Application to the driver circuit of the present invention of this hysteresis comparator will be explained further. When the current passing through the reactor 14 is increased in the ON condition of the switching element 12, the voltage across the current detecting element 13 will also increase and the potential at positive terminal (+) of the voltage comparator 151 is lowered. When this potential at the (+) terminal decreases less than the potential of the (−) terminal, voltage comparator 151 reverse its condition and by this action, its output becomes "L" level and by a positive feedback action of the resistor 154 the output assumes definite low level.

By this level change, the switching element 12 is turned off and the current passing through the reactor 14 decreases and as the consequence the potential at the (+) terminal of the voltage comparator 151 increases and if this potential exceeds the potential of its (−) terminal, the voltage comparator again reverses its situation and delivers high level "H" at its output and turns on the switching element 12 again. Hereinafter the same operation is repeated.

Furthermore, when the control signal $S_c$ becomes high level "H", the voltage across the current detecting element 13 for feeding the voltage comparator 151 increases since a current will flow into the (+) terminal of the voltage comparator 151 via the resistor 156. Namely, the current flowing through the reactor 14 will increase in this case.

The present embodiment had been explained for a case in which the control is effected to arrange the current flowing through the reactor 14 as high level during the OFF time of the controlled switching element 1. However, it is possible that the hysteresis comparator 15 may be modified to have the following functions (1) and (2).

(1) After becoming OFF condition of the controlled switching element 1 (ON condition of the switching element 11), the Off time upper and lower limit values of the hysteresis comparator 15 are not switched immediately and hold the ON time upper and lower limit values and switches the OFF time upper and lower limit values at the predetermined time that the current of the reactor 14 reaches to the about OFF time upper limit value before turning on of the controlled switching element 1 (turning off of the switching element 11), and after this time of, the switching element 11 is turned off.

(2) Immediate after the OFF condition of the controlled switching element 1 (ON condition of the switching element 11), the OFF time upper and lower limit values of the hysteresis comparator 15 are changed to zero, and at the said predetermined time before the ON condition of the controlled switching element (OFF condition of the switching element 11), the threshold level of the hysteresis comparator 15 is switched into the OFF time upper and lower limit value and after this time the switching element 11 is turned off.

Furthermore, it is possible to arrange the reactor 14 to have an iron core and that this iron core becomes a magnetically non-saturated region by a current flowing through the reactor 14 at ON time of the controlled switching element 1 and it becomes a saturated region by a current slightly larger than said current. By this the inductance of the reactor 14 assumes a value near that when such an iron core is not provided and the current flowing through the reactor 14 can be increased or decreased at relatively high speed. It is apparent that this arrangement is quite effective for a driver circuit of a switching element operating at high frequencies.

Furthermore, for the switching element for chopping and controlling object, any kind of transistor or FET etc. may be used. It is obvious that for the current detecting element, resistors, or hole element etc. can be used. The location in the circuit can be altered freely. For instance, the order of connection of the current detecting element and the reactor can be reversed.

As has been explained in the foregoing, the present invention has a particular circuit arrangement and it has a practical function to control the driver current for the controlled switching element being not varied by the voltage variation of the D.C. voltage sources and by the deviation of characteristics of the constituting elements so that a constant current having a sharp overdrive current at build-up time and a very stable switching operation is possible. The invention affords a remarkable practical effect.

In the circuit of the invention, a current limiting resistor can be dispensed with. Thus unnecessary heat production can be prevented and the D.C. voltage sources capacitance can be decreased.

What is claimed is:

1. A driver for a controlled switching element comprising, two D.C. voltage sources connected in series and a series circuit having a switching element for chopping, a current detecting element and a reactor, said switching element being connected to the positive terminal of one of said D.C. voltage sources, the control terminal of said controlled switching element connected to the positive terminal of said one of said D.C. voltage sources through said series circuit, a first current terminal of said controlled switching element connected to a negative terminal of said one of said D.C. voltage sources, a diode having its cathode connected at a connecting point between the chopping switching element and the current detecting element and its anode connected at the negative terminal of the other of said D.C. voltage source, a controlling switching element being operated by a control signal connected between the control terminal of the controlled switching element and the negative terminal of the other of said D.C. voltage source, wherein the chopping switching element is driven by a hysteresis comparator being operated by an output value of the current detecting element and the hysteresis comparator has a threshold value proportional to the current in said reactor, said threshold value being higher during ON time of the controlling switching element than during OFF time.

2. A driver circuit of a controlled switching element as claimed in claim 1, wherein the threshold level of the hysteresis comparator reaches a predetermined value before the OFF time of the controlling switching element.

3. A driver circuit of a controlled switching element as claimed in claim 1, wherein the threshold value of the hysteresis comparator is set to be zero at a time immediately after the ON condition of the controlling switching element and to be the predetermined value at a predetermined time before the OFF condition.

4. A driver circuit of a controlled switching element as claimed in claim 1, wherein the reactor is provided with an iron core arranged to be magnetically non-saturated by a current flowing through the reactor when the hysteresis comparator is operating at the lower set value, and to be magnetically saturated by the current flowing through the reactor when the hysteresis comparator is operating at the higher set value so that the inductance value is equal to that of air core reactor.

* * * * *

UNITED STATES PATENT AND TRADEMARK OFFICE
CERTIFICATE OF CORRECTION

PATENT NO. : 5,077,487
DATED : December 31, 1991
INVENTOR(S) : Katsuji Iida

It is certified that error appears in the above-identified patent and that said Letters Patent is hereby corrected as shown below:

Column 1, line 38, after "D.C.", insert --voltage--;

Column 5, line 27, delete "of";

Column 6, line 28, change "source" to --sources--;
Column 6, line 32, change "source" to --sources--;

Signed and Sealed this

First Day of June, 1993

Attest:

MICHAEL K. KIRK

Attesting Officer

Acting Commissioner of Patents and Trademarks